United States Patent
Ikeda et al.

(10) Patent No.: US 11,908,663 B2
(45) Date of Patent: Feb. 20, 2024

(54) PLASMA PROCESSING APPARATUS

(71) Applicant: Tokyo Electron Limited, Tokyo (JP)

(72) Inventors: Taro Ikeda, Nirasaki (JP); Toshifumi Kitahara, Fuchu (JP)

(73) Assignee: Tokyo Electron Limited, Tokyo (JP)

(*) Notice: Subject to any disclaimer, the term of this patent is extended or adjusted under 35 U.S.C. 154(b) by 337 days.

(21) Appl. No.: 17/299,430

(22) PCT Filed: Nov. 26, 2019

(86) PCT No.: PCT/JP2019/046223
§ 371 (c)(1),
(2) Date: Jun. 3, 2021

(87) PCT Pub. No.: WO2020/116250
PCT Pub. Date: Jun. 11, 2020

(65) Prior Publication Data
US 2022/0084797 A1 Mar. 17, 2022

(30) Foreign Application Priority Data
Dec. 6, 2018 (JP) ................................. 2018-229262

(51) Int. Cl.
*H01J 37/32* (2006.01)
(52) U.S. Cl.
CPC .. *H01J 37/32568* (2013.01); *H01J 37/32082* (2013.01); *H01J 37/32449* (2013.01)
(58) Field of Classification Search
CPC .......... H01J 37/32082; H01J 37/32155; H01J 37/32449; H01J 37/32541; H01J 37/32568; H01J 37/32724
See application file for complete search history.

(56) References Cited

U.S. PATENT DOCUMENTS

| | | | |
|---|---|---|---|
| 2004/0013818 A1* | 1/2004 | Moon | C23C 16/4405 134/1.1 |
| 2016/0172217 A1* | 6/2016 | Miyata | H01J 37/32834 156/345.29 |
| 2017/0069493 A1* | 3/2017 | Sheng | C23C 16/45565 |
| 2017/0103871 A1* | 4/2017 | An | G01R 29/02 |
| 2019/0189396 A1* | 6/2019 | Iwase | C23C 16/507 |

FOREIGN PATENT DOCUMENTS

| | | |
|---|---|---|
| JP | H11-260596 A | 9/1999 |
| JP | 2007-221116 A | 8/2007 |
| JP | 2016-015496 A | 1/2016 |
| KR | 10-2012-0093793 A | 8/2012 |
| WO | 2010140526 A1 | 12/2010 |

* cited by examiner

*Primary Examiner* — Tung X Le
(74) *Attorney, Agent, or Firm* — Armstrong Teasdale LLP

(57) ABSTRACT

Provided is a plasma processing apparatus capable of suppressing abnormal discharge. The plasma processing apparatus includes: an upper electrode and a lower electrode which are disposed inside a processing container so as to face each other inside the processing container; and a dielectric shower for gas introduction disposed below the upper electrode, wherein the plasma processing apparatus generates plasma in a space between the upper electrode and the lower electrode. The upper electrode includes: at least one slot configured to introduce VHF waves into the processing container; and a gas flow path provided independently of the at least one slot and in communication with the dielectric shower.

6 Claims, 6 Drawing Sheets

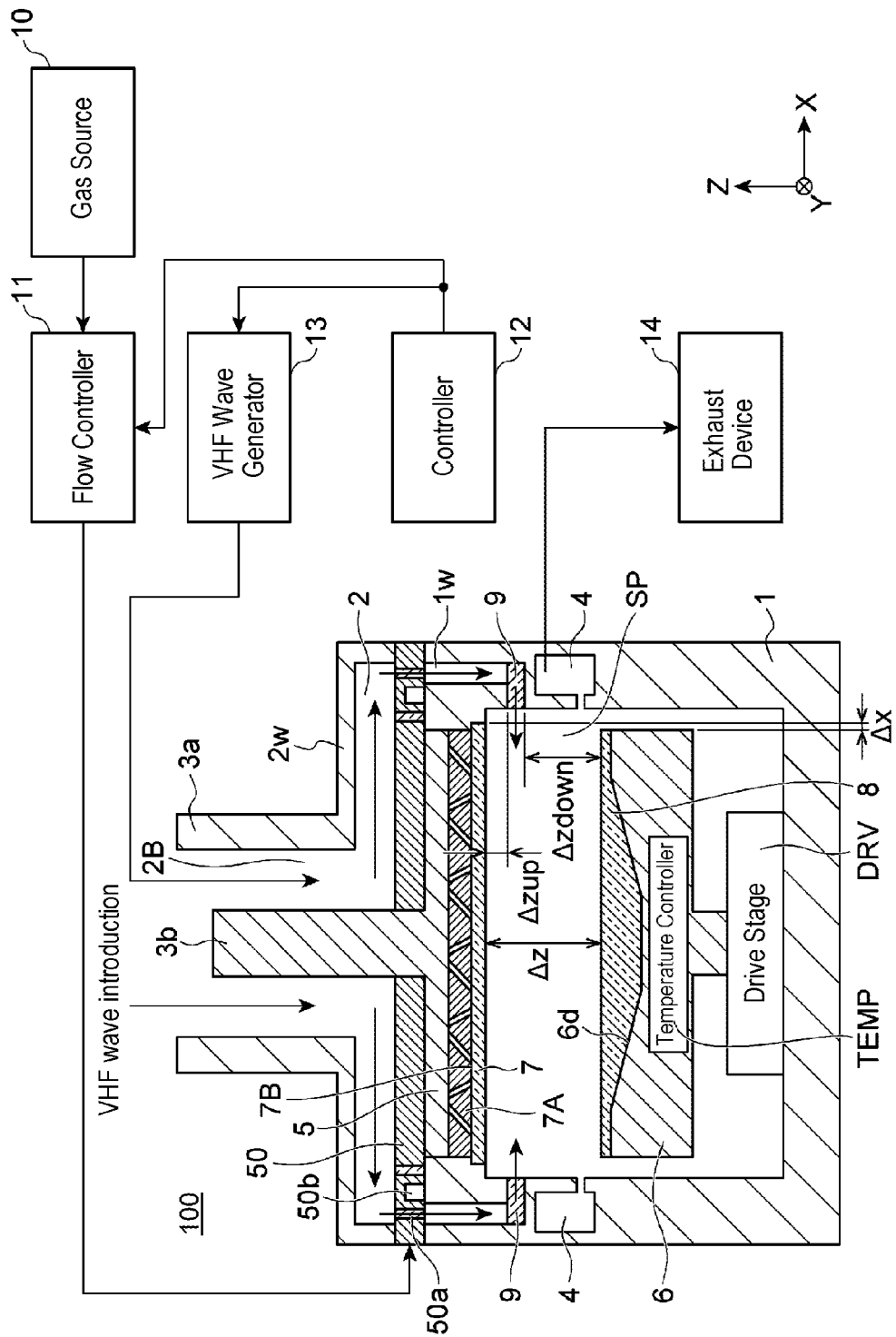

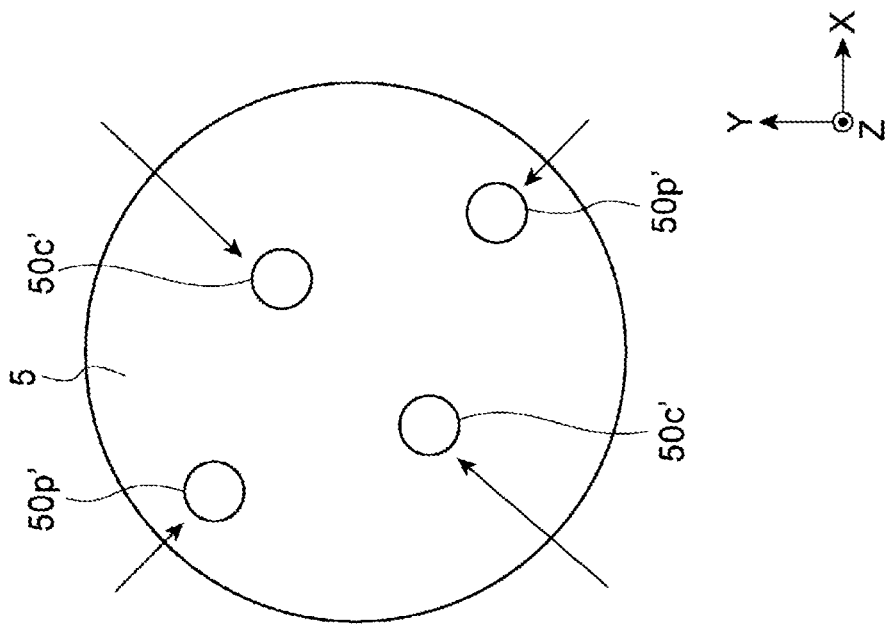
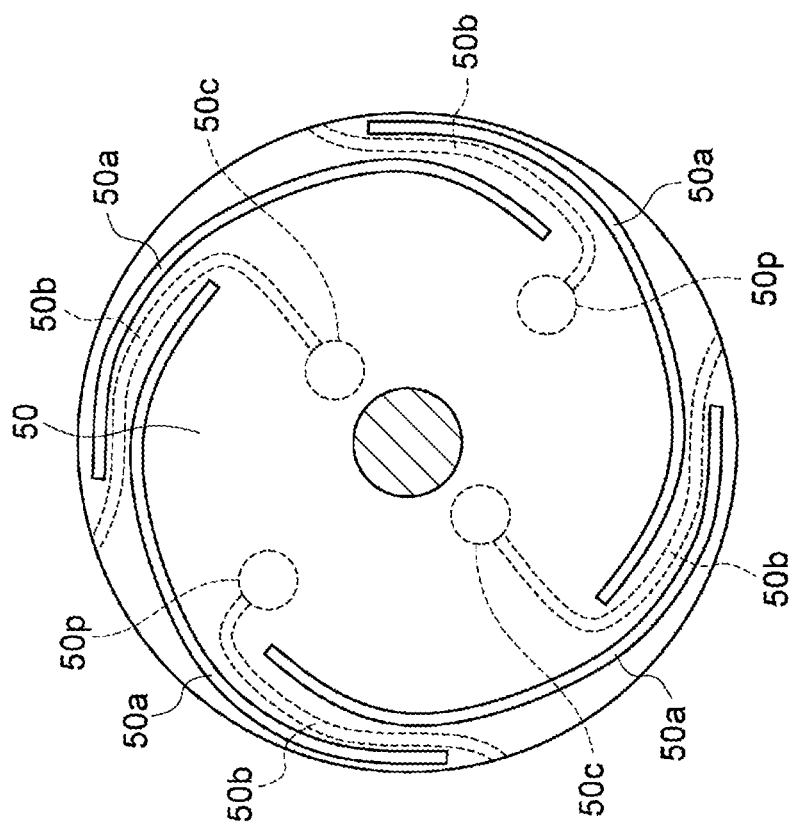

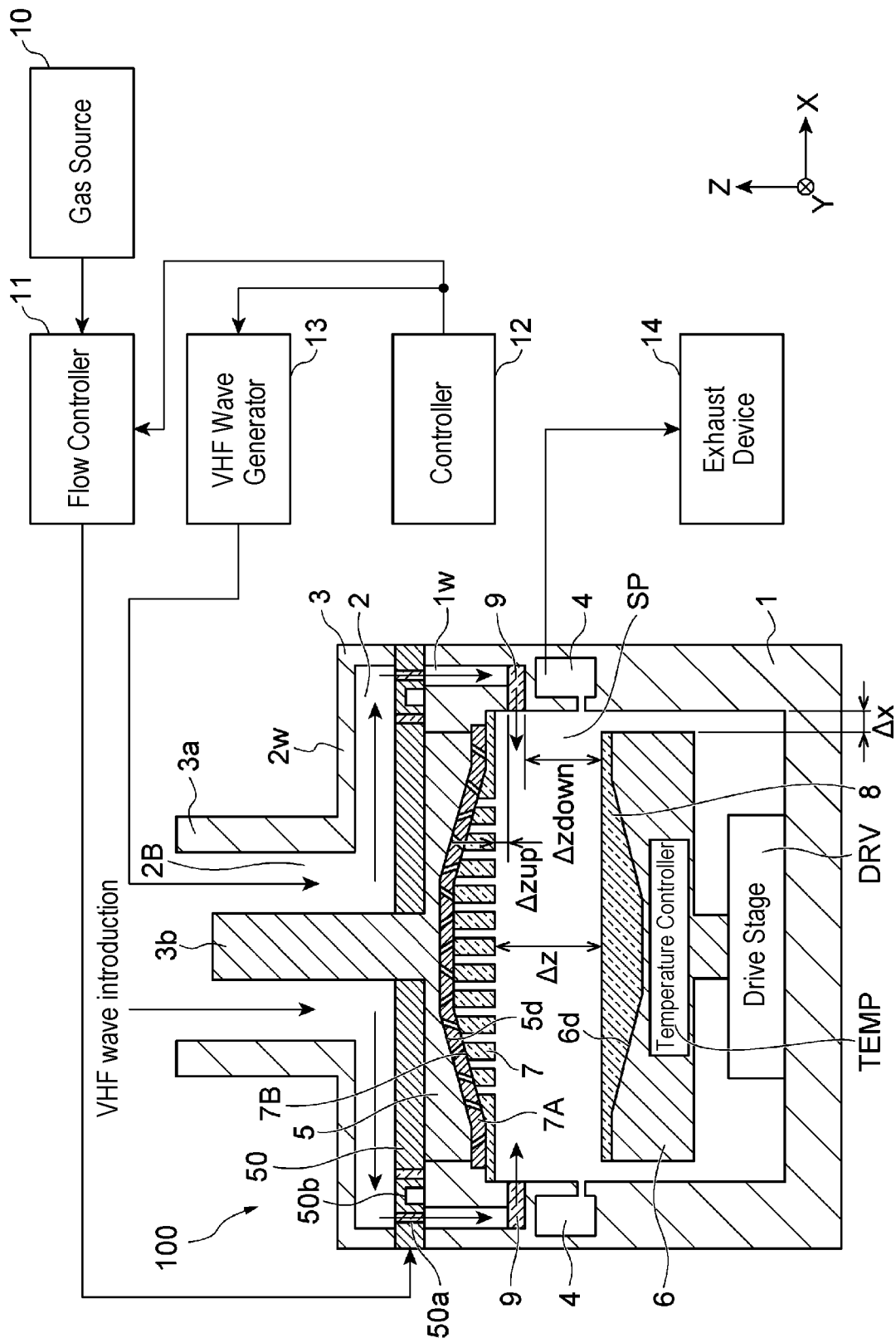

PLASMA PROCESSING APPARATUS

CROSS-REFERENCE TO RELATED APPLICATIONS

This application is a National Stage Application of International Patent Application No. PCT/JP2019/046223, having an International Filing Date of Nov. 26, 2019, which claims the benefit of priority to Japanese Patent Application No. 2018-229262, filed Dec. 6, 2018, the entire contents of each of which are hereby incorporated by reference herein.

TECHNICAL FIELD

An exemplary embodiment of the present disclosure relates to a plasma processing apparatus.

BACKGROUND

Conventional plasma processing apparatuses are disclosed in Patent Documents 1 and 2. Although there are various plasma generation methods, a capacitively coupled plasma (CCP) processing apparatus that uses a frequency in a very-high-frequency (VHF) band for plasma generation has been attracting attention. The VHF band represents a frequency in the range of about 30 MHz to 300 MHz.

PRIOR ART DOCUMENTS

Patent Documents

Patent Document 1: Japanese laid-open publication No. 2016-015496
Patent Document 2: Japanese laid-open publication No. 2007-221116

As a result of earnest research by the present inventors, it was found that, when VHF waves are supplied into a processing container, abnormal discharge may occur in an inflow path through which an introduced gas flows into the processing container, and such an abnormal discharge is not preferable from the viewpoint of plasma stability or the like. That is, when the VHF waves is introduced into the processing container, a waveguide is used. Since the waveguide is connected to the interior of the processing container, the waveguide may also be used for gas introduction. In this case, energy is applied to the gas so that the abnormal discharge occurs. A plasma processing apparatus capable of suppressing the abnormal discharge is required.

SUMMARY

A plasma processing apparatus according to an exemplary embodiment includes an upper electrode and a lower electrode which are disposed inside a processing container so as to face each other inside the processing container; and a dielectric shower for gas introduction disposed below the upper electrode, wherein the plasma processing apparatus generates plasma in a space between the upper electrode and the lower electrode, and wherein the upper electrode includes at least one slot configured to introduce VHF waves into the processing container, and a gas flow path provided independently of the at least one slot and in communication with the dielectric shower.

According to the plasma processing apparatus of an exemplary embodiment, it is possible to suppress abnormal discharge, and thus to generate stable plasma.

BRIEF DESCRIPTION OF DRAWINGS

FIG. 1 is a view for explaining a vertical cross-sectional structure of a plasma processing apparatus.
FIG. 2A is a plan view of a first upper component (an upper electrode) for performing introduction of VHF waves and gas,
and FIG. 2B is a plan view of the upper electrode.
FIG. 3 is a view for explaining a vertical cross-sectional structure of a plasma processing apparatus.

DETAILED DESCRIPTION

Figure 4:
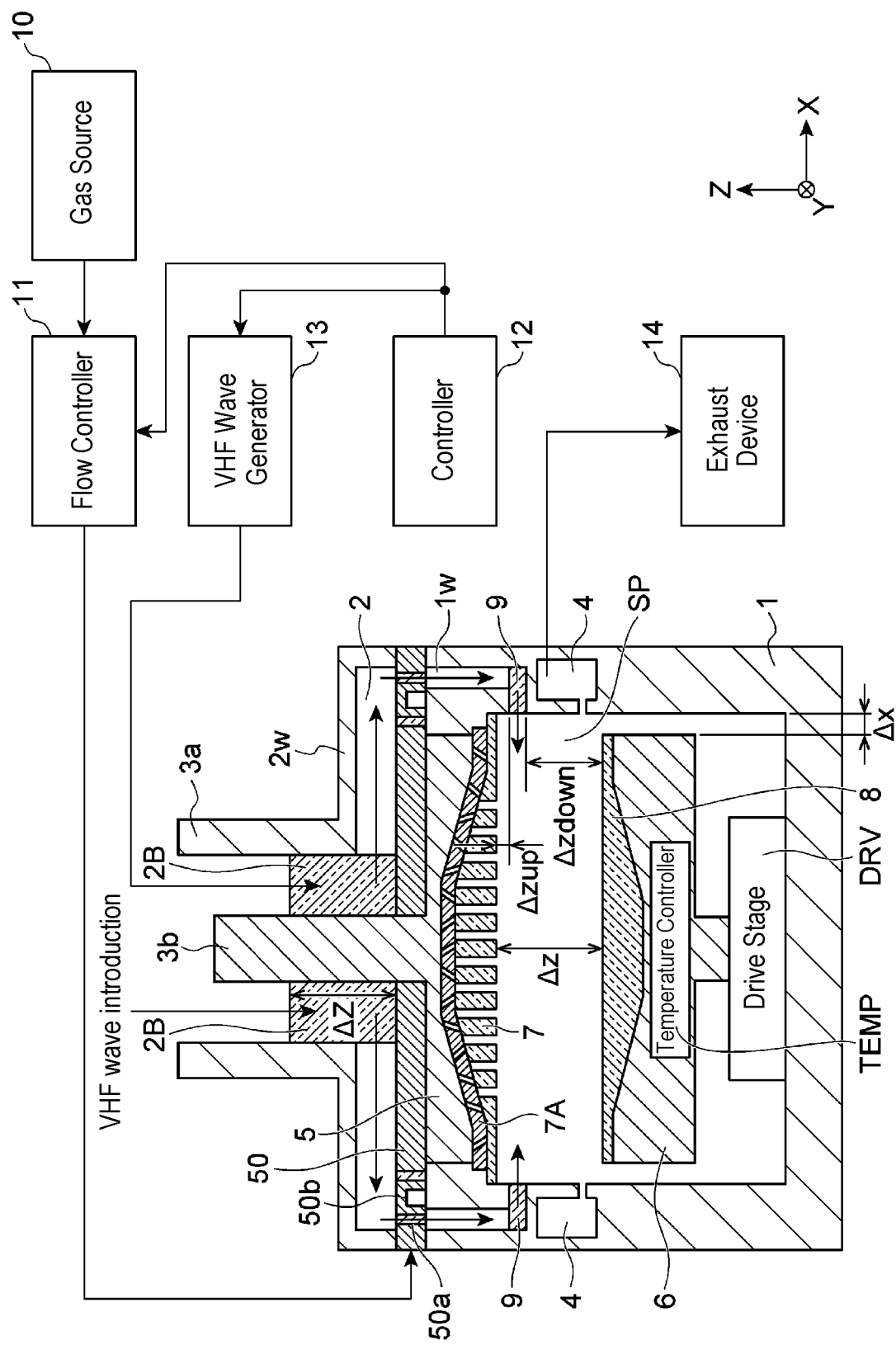
FIG. 4 is a view for explaining a vertical cross-sectional structure of a plasma processing apparatus.

A first plasma processing apparatus includes an upper electrode and a lower electrode which are disposed inside a processing container so as to face each other inside the processing container, and a dielectric shower for gas introduction disposed below the upper electrode. The plasma processing apparatus generates plasma in a space between the upper electrode and the lower electrode. The upper electrode includes a slot configured to introduce VHF waves into the processing container, and a gas flow path provided independently of the slot and in communication with the dielectric shower.

According to this plasma processing apparatus, since the gas flow path is provided independently of the slot configured to introduce the VHF waves, the VHF waves do not enter the gas flow path, and abnormal discharge due to the VHF waves is suppressed, thereby stabilizing the plasma.

A second plasma processing apparatus further includes a gas diffusion plate interposed between the gas flow path and the dielectric shower to diffuse the gas in the circumferential direction and the radial direction. Due to the presence of the gas diffusion plate, a gas concentration distribution can be made uniform.

In a third plasma processing apparatus, a plurality of slots is provided. Each of the plurality of slots extends along the circumferential direction of the upper electrode, and the gas flow path is disposed between the slots located adjacent to each other in the radial direction of the upper electrode. Since it is possible to introduce many VHF waves into the processing container through the plurality of slots, it is possible to improve the in-plane uniformity of plasma.

In a fourth plasma processing apparatus, the gas flow path includes a first flow path configured to supply the gas to a central region of the dielectric shower and a second flow path configured to supply the gas to a peripheral region of the dielectric shower. This makes it possible to introduce the gas into both the central region and the peripheral region, and thus to control the gas concentration distribution inside the processing container.

A fifth plasma processing apparatus further includes a metal film formed on an upper surface of the dielectric shower. Thermal spraying or the like may be used to form the metal film, and metal particles melted by heating are sprayed onto the surface of an object. As the metal, Al or the like may be used. Through the thermal spraying, the upper surface of the dielectric shower is electromagnetically shielded so that abnormal plasma is less likely to be generated inside the dielectric shower, and the upper surface of the dielectric shower is protected from the gas. This suppresses deterioration.

In a sixth plasma processing apparatus, a plurality of slots is provided. Each of the plurality of slots extends in the circumferential direction of the upper electrode, and one end of each slot is located radially more outward of the upper electrode than the other end. The gas flow path is disposed between the slots located adjacent to each other in the radial direction of the upper electrode. In this case, it is possible to arrange the plurality of slots so as to cover many regions in the circumferential direction, which enables many VHF waves to be introduced into the processing container through these slots. Thus, it is possible to improve the in-plane uniformity of plasma.

Hereinafter, plasma processing apparatuses according to embodiments will be described. The same components will be designated by like reference numerals with the descriptions thereof omitted.

FIG. 1 is an explanatory view illustrating a configuration of a plasma processing apparatus 100 (a first embodiment). For the sake of convenience in description, a three-dimensional Cartesian coordinate system is set. It is assumed that a vertical direction of the plasma processing apparatus is a Z-axis direction, and two directions perpendicular to the Z-axis direction are an X-axis direction and a Y-axis direction, respectively.

The plasma processing apparatus 100 corresponds to a plasma processing apparatus which includes an upper electrode 5 and a lower electrode 6 disposed so as to face each other inside a processing container 1, and is configured to generate plasma in a space SP between these electrodes. The lower electrode 6 has a recess 6d formed on an upper surface thereof. Further, an upper dielectric 7 having a flat exposed surface formed at a lower side thereof is provided on a lower surface of the upper electrode 5. A lower dielectric 8 is provided in the recess 6d of the lower electrode 6. VHF wave introduction portions 9 are provided at lateral end portions of the space SP between the upper dielectric 7 and the lower dielectric 8. The upper electrode 5 is defined to include an upper component 50 disposed above the upper electrode 5 in addition to the upper electrode 5 as a main body located below. Further, the upper electrode 5 as the main body and the upper component 50 may be provided as a unit.

A VHF wave waveguide 2 made of a dielectric material is provided in the vicinity of an upper opening end of the processing container 1. In the VHF wave waveguide 2, an example of the dielectric material is air in this embodiment, but quartz, alumina, or the like may be used as the dielectric material. The VHF wave waveguide 2 extending in the horizontal direction includes a waveguide side wall 2w located at an upper portion thereof. The center of the upper component 50 is opened to form an opening. A side wall around the opening constitutes an outer conductor 3a as a portion of a coaxial tube. An inner conductor 3b is disposed at the center of the coaxial tube. The inner conductor 3b is formed integrally with the upper electrode 5 so as to be electrically connected to the upper electrode 5.

The upper dielectric 7 (a dielectric shower) is provided on the lower surface of the upper electrode 5. The dielectric shower has a plurality of through-holes as gas flow paths extending in the vertical direction. A lower surface of the upper dielectric 7 is flat and parallel to the X-Y plane. Planar shapes (viewed in the Z-axis direction) of the upper dielectric 7 and the upper electrode 5 are circular. The upper dielectric 7 has a uniform thickness.

The recess 6d of a mortar-shape is formed in the upper surface of the lower electrode 6, and the lower dielectric 8 is embedded in the recess 6d. An upper surface of the lower dielectric 8 is flat and parallel to the X-Y plane. Planar shapes (viewed in the Z-axis direction) of the lower dielectric 8 and the lower electrode 6 are circular. The lower dielectric 8 is thicker in the central portion and thinner in the outer peripheral portion. The central region of a lower surface of the lower dielectric 8 is flat and parallel to the X-Y plane, and the outermost region of the lower surface of the lower dielectric 8 is also flat and parallel to the X-Y plane. However, a region between the central region and the outermost region is a conical surface which corresponds to an inclined surface having a planar shape that increases in diameter from a lower portion toward an upper portion.

VHF waves introduced into the central portion of the VHF wave waveguide 2 extending in the horizontal direction propagate radially to the peripheral portion in the horizontal direction. Thereafter, the VHF waves travel downward through a waveguide 1w constituted with a recess (which has a circular ring planar shape and has a depth in the Z-axis direction) provided in the side wall of the processing container 1, introduced into the VHF wave introduction portion 9, and travel from the outer peripheral portion toward the central portion. A planar shape of the VHF wave introduction portion 9 is circular. The VHF waves travel from all azimuths in the horizontal direction toward the axial center of the processing container. The VHF wave introduction portion 9 is located in a lateral end portion of the space SP for plasma generation.

The VHF waves generated from a VHF wave generator 13 pass through the waveguide, and are introduced into the VHF wave waveguide 2 extending in the horizontal direction. Thereafter, as described above, when the VHF waves are introduced from the VHF wave introduction portion 9 between the upper electrode 5 and the lower electrode 6, the gas inside the processing container 1 is plasmarized to generate plasma. In this case, the VHF wave introduction portion 9 is located at the lateral end portion (horizontal end portion), and the VHF waves are introduced into the space in various lateral directions. This makes it difficult for standing waves to be formed. In addition, an electric field vector generated between the upper electrode 5 and the lower electrode 6 tends to be inclined vertically downward and outward in the outer peripheral regions of the electrodes. However, since the lower electrode 6 is provided with the recess 6d and the lower dielectric 8 is provided in the recess 6d, the in-plane distribution of electric fields in the vicinity of the stage may become uniform. Furthermore, the lower dielectric 8 is thinner in the outer peripheral portion than in the central portion. In particular, the orientation and magnitude of an electric field vector affected by a dielectric also depend on a thickness of the dielectric. Therefore, by setting the thickness to be smaller in the outer peripheral portion of the dielectric, it is possible to improve the in-plane uniformity of the electric field vector strength. Therefore, by introducing the VHF waves in the lateral direction and making the orientation of the electric field vector uniform, it is possible to make the in-plane distribution of plasma generated between the upper electrode 5 and the lower electrode 6 uniform.

In addition, the lower dielectric 8 is thinner in the outer peripheral portion than in the central portion. In particular, the orientation and magnitude of the electric field vector affected by the dielectric also depend on the thickness of the dielectric. Therefore, by setting the thickness to be smaller in the outer peripheral portion of the dielectric, it is possible to improve the in-plane uniformity of the electric field vector strength. In the lower dielectric 8, the surface opposite to the space SP for plasma generation is inclined in the shape of a mortar. This inclination makes it possible to make a corresponding electric field vector directed more vertically, and thus to improve the in-plane uniformity of plasma. That is, the lower dielectric 8 has a lens function of bending the electric field vector.

Further, the upper dielectric 7 and the lower dielectric 8 are coaxially arranged with the space SP interposed therebetween. This is because it is possible to improve the in-plane uniformity of plasma when the axes of the electrodes coincide with each other. In addition, a vertical separation distance Δzup from the lower surface of the upper dielectric 7 to the VHF wave introduction portion 9 is equal to a vertical separation distance Δzdown from the upper surface of the lower dielectric 8 to the VHF wave introduction portion 9. When these distances are equal, the distances from the VHF wave introduction position to respective dielectrics are equal. Thus, plasma generated due to VHF waves tends to be uniform in the vertical direction. A distance Δz between the upper dielectric 7 and the lower dielectric 8 is preferably, for example, 5 mm to 80 mm from the viewpoint of generating uniform plasma. In addition, a distance Δx corresponding to a difference between the radius of the upper dielectric 7 and the radius of the lower dielectric 8 preferably has a value close to 0. This is because plasma generation conditions become symmetric and the uniformity of plasma is improved.

The lower electrode 6 is moved in the vertical direction by a drive stage DRV. This makes it possible to generate plasma under an optimum condition. The lower electrode 6 is provided with a temperature controller TEMP. The temperature controller TEMP includes a medium passage through which a cooling medium flows, a heater, and a temperature sensor, and is controlled by a controller 12 such that a temperature of the lower electrode 6 reaches a target temperature. For example, control may be performed such that, when the target temperature is T1 degrees C. and the output of the temperature sensor is lower than T1 degrees C., the heater is heated, and when the output is higher than T1 degrees C., the cooling medium is caused to flow through the medium passage without heating the heater.

The controller 12 also controls an exhaust device 14. The exhaust device 14 exhausts the gas in an annular exhaust passage 4 provided in the outer wall of the processing container 1. The exhaust passage 4 is provided in the lateral direction of the plasma generation space SP, and communicates with a plurality of exhaust holes provided in the inner surface of the processing container along the circumferential direction. This makes it possible to exhaust the gas in the plasma generation space SP, and thus to set a pressure in this space to an appropriate value. This pressure may be changed depending on a processing content, and may be set to, for example, 0.1 Pa to 100 Pa. As the exhaust device 14, a pump commonly used in a vacuum system apparatus, such as a rotary pump, an ion pump, a cryostat, or a turbo molecular pump, may be employed.

The controller 12 controls a flow controller 11 that controls a flow rate of the gas generated from a gas source 10. The flow controller 11 may be a simple valve. This makes it possible to introduce a target gas into the processing container 1. The controller 12 also controls the VHF wave generator 13. The frequency of VHF waves is about 30 MHz to 300 MHz.

Examples of gases that can be used for the gas source 10 may include gases containing carbon and fluorine, such as $CF_4$ and $C_4F_8$, and gases such as $N_2$ and $O_2$, in addition to noble gases such as Ar.

Aluminum may be used as the material of the upper electrode 5 and the lower electrode 6. Aluminum nitride (AlN) may be used as the material of the upper dielectric 7 and the lower dielectric 8. As the material of the VHF wave waveguide 2 extending in the horizontal direction, air is used, but a dielectric material, such as quartz or alumina, may be used as the material of the VHF wave waveguide 2 as long as the waveguide can be formed. The material of the upper component 50 may be the same as that of the upper electrode 5, and a solid dielectric material, such as alumina, may be used as the dielectric material in a slot 50a.

As for a substrate disposed on the lower dielectric 8, silicon or the like may be used, and the substrate may be subjected to processing such as film formation or etching. If necessary, it is conceivable to provide an electrostatic chuck, to apply a DC bias potential to the lower dielectric 8, or in some cases, to apply a radio-frequency voltage between the upper and lower electrodes. It is also conceivable to arrange magnets around the processing container.

FIG. 2A is a plan view of a first upper component (an upper electrode) for performing introduction of VHF waves and gas, that is, a plan view of the upper component (the upper electrode) and FIG. 2B is a plan view of the upper electrode 5.

As described above, the plasma processing apparatus includes the upper electrode 5 and the lower electrode 6, which are disposed so as to face each other in the processing container, and the dielectric shower for gas introduction disposed below the upper electrode 5. Plasma is generated in the space between the upper electrode 5 and the lower electrode 6.

Here, the upper component 50 of the upper electrode 5 includes the slot 50a for introducing VHF waves into the processing container 1, and a gas flow path 50b provided independently of the slot 50a and communicating with the upper dielectric (the dielectric shower). A plurality of slots 50a and a plurality of gas flow paths 50b may be provided. A dielectric material for slot sealing (e.g., alumina ($Al_2O_3$)) is embedded in the slots 50a inside the opening. For the sake of convenience in description, the same reference numeral is used for the slots and the dielectric material for slot sealing in the drawings.

According to this plasma processing apparatus, since the gas flow paths 50b are provided independently of the slots 50a for introducing VHF waves, the VHF waves do not enter the gas flow paths 50b, and abnormal discharge due to the VHF waves is suppressed, which makes plasma stable. Four gas flow paths 50b extend along the circumferential direction, and each of the four gas flow paths 50b has a gas introduction port in the outer peripheral side wall of the upper component 50. Two of the gases introduced from these four gas introduction ports reach gas introduction ports 50c for gas introduction into the central region (downwardly-opened holes), and the remaining two gases reach gas introduction ports 50p for gas introduction into the peripheral region (downwardly-opened holes). The gas introduction ports 50c for gas introduction into the central region extend vertically to respective gas introduction ports 50c' of the upper electrode 5 located therebelow, and the remaining two gas introduction ports reach respective gas introduction ports 50p' for gas introduction into the peripheral region. Since a gas diffusion plate 7A and the dielectric shower are disposed directly below the gas introduction ports, the gas which is uniformly diffused in in-plane concentration in an efficient manner can reach the plasma generation space SP.

In addition, since the gas diffusion plate 7A is interposed between the gas flow paths 50b and the dielectric shower (the upper dielectric 7), it is possible to diffuse the gas in the circumferential direction and the radial direction. Due to the presence of the gas diffusion plate 7A, the gas concentration distribution can be made more uniform. The gas diffusion plate 7A is made of an insulator such as AlN, alumina, and $SiO_2$, but may also be made of a mesh electrode or the like.

The upper component 50 includes the plurality of slots 50a. Each of the plurality of slots 50a extends in the circumferential direction of the upper component of the upper electrode. In addition, the gas flow path 50b is disposed between the slots 50a adjacent to each other in the radial direction of the upper electrode, which enables many VHF waves to be introduced into the processing container 1 through the plurality of slots 50a. Therefore, it is possible to improve the in-plane uniformity of plasma.

The gas flow path 50b includes a first flow path configured to supply gas to the central region of the dielectric shower (the upper dielectric 7) (the flow path reaching the gas introduction port 50c) and a second flow path configured to supply gas to the peripheral region of the dielectric shower (the flow path reaching the gas introduction port 50p). This makes it possible to introduce gas into both the central region and the peripheral region, and thus to control a gas concentration distribution in the processing container 1.

In addition, a metal film 7B is formed on the upper surface of the dielectric shower (the upper dielectric 7). Thermal spraying or the like may be used to form the metal film 7B. Metal particles melted by heating are sprayed onto the surface of an object. As the metal, Al or the like may be used. Through this thermal spraying, the upper surface of the dielectric shower is electromagnetically shielded so that abnormal plasma is less likely to be generated inside the dielectric shower, and the upper surface of the dielectric shower is protected from gas. Thus, deterioration is suppressed. The metal film 7B is not attached to the inner surface of a through-hole in the dielectric shower. In addition, the dielectric shower (the upper dielectric 7) has the plurality of through-holes extending in the vertical direction. Thus, gas from the gas flow paths is introduced into the processing space through the through-holes.

In FIGS. 2A and 2B, the plurality of slots 50a is provided, and each of the plurality of slots 50a extends in the circumferential direction of the upper component 50 of the upper electrode. One end of each slot 50a is located radially more outward of the upper electrode than the other end. The gas flow path 50b is disposed between the slots 50a adjacent to each other in the radial direction of the upper electrode. In this case, it is possible to arrange the plurality of slots 50a so as to cover many regions in the circumferential direction, thereby enabling many VHF waves to be introduced into the processing container 1 through the slots 50a. Thus, it is possible to improve the in-plane uniformity of plasma.

FIG. 3 is an explanatory view illustrating a configuration of a plasma processing apparatus 100 (a second embodiment).

The plasma processing apparatus 100 is a plasma processing apparatus which includes an upper electrode 5 and a lower electrode 6 disposed so as to face each other in the processing container 1, and is configured to generate plasma in the space SP between these electrodes. The upper electrode 5 and the lower electrode 6 are provided with recesses 5d and 6d on the surfaces facing each other, respectively. An upper dielectric 7 and a lower dielectric 8 are provided in the recesses in the upper electrode 5 and the lower electrode 6, respectively, and lateral end portions of the space SP between the upper dielectric 7 and the lower dielectric 8 are provided with a VHF wave introduction portion 9. The upper electrode includes, in addition to the upper electrode 5 as a main body located below, an upper component 50 disposed above the upper electrode 5. The upper electrode 5 as the main body and the upper component 50 may be provided integrally with each other.

A VHF wave waveguide 2 made of a dielectric material is provided in the vicinity of an upper opening end of the processing container 1. In the VHF wave waveguide 2, air is exemplified as the dielectric material, but quartz, alumina, or the like may also be adopted as the dielectric material. The VHF wave waveguide 2 extending in the horizontal direction includes a waveguide side wall 2w, which is located at the upper portion thereof. The center of the upper component 50 forms an opening, a side wall around the opening constitutes an outer conductor 3a of a coaxial tube, and an inner conductor 3b is disposed at the center of the coaxial tube. The inner conductor 3b is formed integrally with the upper electrode 5, and is electrically connected to the upper electrode 5.

The recess 5d is formed to have a mortar shape in the lower surface of the upper electrode 5. An upper dielectric 7 (dielectric shower) is embedded in the recess 5d. In the dielectric shower, a plurality of through-holes as gas flow paths extend in the vertical direction. A lower surface of the upper dielectric 7 is flat and parallel to the X-Y plane. Planar shapes (viewed in the Z-axis direction) of the upper dielectric 7 and the upper electrode 5 are circular. The lower dielectric 7 is thicker in the central portion and thinner in the outer peripheral portion. The central region of the upper surface of the upper dielectric 7 is flat and parallel to the X-Y plane, and the outermost region of the upper surface of the upper dielectric 7 is also flat and parallel to the X-Y plane. However, a region between the central region and the outermost region is a conical surface, and is formed by an inclined surface, the planar shape of which increases in diameter from an upper portion toward a lower portion.

The recess 6d is formed to have a mortar shape in the upper surface of the lower electrode 6, and the lower dielectric 8 is embedded in the recess 6d. An upper surface of the lower dielectric 8 is flat and parallel to the X-Y plane. Planar shapes (viewed in the Z-axis direction) of the lower dielectric 8 and the lower electrode 6 are circular. The lower dielectric 8 is thicker in the central portion and thinner in the outer peripheral portion. The central region of the lower surface of the lower dielectric 8 is flat and parallel to the X-Y plane, and the outermost region of the lower surface of the lower dielectric 8 is also flat and parallel to the X-Y plane. However, a region between the central region and the outermost region is a conical surface, and is formed by an inclined surface, the planar shape of which increases in diameter from a lower portion toward an upper portion.

VHF waves introduced into the central portion of the VHF waveguide 2 extending in the horizontal direction propagate radially to the peripheral portion in the horizontal direction. Thereafter, the VHF waves travel downward through a waveguide 1w constituted with a recess (which has a circular ring planar shape and has a depth in the Z-axis direction) provided in the side wall of the processing container 1, are introduced into the VHF wave introduction portion 9, and travel to the central portion from the outer peripheral portion. A planar shape of the VHF wave introduction portion 9 is a circular ring shape, and the VHF waves travel from all azimuths in the horizontal direction toward the axial center of the processing container. The VHF wave introduction portion 9 is located in the lateral end portions of the plasma generation space SP.

The VHF waves generated from a VHF wave generator 13 pass through the waveguide, and are introduced into the VHF wave waveguide 2 extending in the horizontally direction. Thereafter, as described above, when the VHF waves are introduced from the VHF wave introduction portion 9 between the upper electrode 5 and the lower electrode 6, the gas inside the processing container is plasmarized to generate plasma. In this case, the VHF wave introduction portion 9 is located at the lateral end portions (horizontal end portions), and the VHF waves are introduced from various lateral directions into this space. Thus, there is an advantage in that it is difficult for standing waves to be formed. In addition, electric field vectors generated between the upper electrode 5 and the lower electrode 6 tend to be inclined downward and outward from the vertical direction in the outer peripheral region of the electrode, and each of the upper electrode 5 and the lower electrode is provided with a recess. Since the upper electrode 5 and the lower electrode 6 are provided with the upper dielectric 7 and the lower dielectric 8, respectively, it is possible to make the electric field vectors uniform in a plane by the dielectrics. Therefore, by the introduction of the VHF waves in the lateral direction and making the orientation of the electric field vectors uniform, the in-plane distribution of plasma generated between the upper electrode 5 and the lower electrode 6 can be made uniform.

In addition, each of the upper dielectric 7 and the lower dielectric 8 is thinner in the outer peripheral portion than in the central portion. In particular, the orientation and magnitude of the electric field vector affected by the dielectric also depend on the thickness of the dielectric. Therefore, by setting the thickness to be smaller in the outer peripheral portion of the dielectric, it is possible to improve the in-plane uniformity of the electric field vector strength. In the upper dielectric 7 and the lower dielectric 8, the surfaces opposite to the plasma generation space SP are inclined in the shape of a mortar. This inclination makes it possible to make a corresponding electric field vector directed more vertically, and to improve the in-plane uniformity of plasma. That is, the upper dielectric 7 and the lower dielectric 8 have a lens function of bending the electric field vector. In other words, the dielectric shower becomes thinner towards the peripheral region. In this case, the electric field vector of the VHF waves in the peripheral region tends to be the same as that in the central region. Thus, the in-plane uniformity of the electric field vector becomes high.

Further, the upper dielectric 7 and the lower dielectric 8 are coaxially arranged with the space SP interposed therebetween. This is because it is possible to improve the in-plane uniformity of plasma when the axes between the electrodes coincide with each other. In addition, a vertical separation distance $\Delta z_{up}$ from the lower surface of the upper dielectric 7 to the VHF wave introduction portion 9 is equal to a vertical separation distance $\Delta z_{down}$ from the upper surface of the lower dielectric 8 to the VHF wave introduction portion 9. When these distances are equal, the distances from the VHF wave introduction position to respective dielectrics are equal. Thus, plasma generated due to the VHF waves tends to be uniform in the vertical direction. A distance $\Delta z$ between the upper dielectric 7 and the lower dielectric 8 is preferably, for example, 5 mm to 80 mm from the viewpoint of generating uniform plasma. In addition, a distance $\Delta x$ corresponding to a difference between the radius of the upper dielectric 7 and the radius of the lower dielectric 8 preferably has a value close to 0. This is because plasma generation conditions become symmetric and the uniformity of plasma is improved.

The lower electrode 6 is capable of being moved in the vertical direction by a drive stage DRV. This makes it possible to generate plasma under an optimum condition. The lower electrode 6 is provided with a temperature controller TEMP. The temperature controller TEMP includes a medium passage through which a cooling medium flows, a heater, and a temperature sensor, and is controlled by the controller 12 such that a temperature of the lower electrode 6 reaches a target temperature. For example, control may be performed such that, when the target temperature is T1 degrees C. and the output of the temperature sensor is lower than T1 degrees C., the heater is heated, and when the output is higher than T1 degrees C., the cooling medium is caused to flow through the medium passage without heating the heater.

The controller 12 also controls an exhaust device 14. The exhaust device 14 exhausts the gas in an annular exhaust passage 4 provided in the outer wall of the processing container 1. The exhaust passage 4 is provided in the lateral direction of the plasma generation space SP, and communicates with a plurality of exhaust holes provided along the circumferential direction in the inner surface of the processing container. This makes it possible to exhaust the gas in the plasma generation space SP, and thus to set a pressure in this space to an appropriate value. This pressure may be changed depending on a processing content, and may be set to, for example, 0.1 Pa to 100 Pa. As the exhaust device 14, a pump commonly used in a vacuum system apparatus, such as a rotary pump, an ion pump, a cryostat, or a turbo molecular pump, may be employed.

The controller 12 controls a flow controller 11 that controls a flow rate of the gas generated from a gas source 10. The flow controller 11 may be a simple valve. This makes it possible to introduce a target gas into the processing container 1. The controller 12 also controls a VHF wave generator 13. The frequency of VHF waves is about 30 MHz to 300 MHz.

Examples of gases that can be used for the gas source 10 may include gases containing carbon and fluorine, such as $CF_4$ and $C_4F_8$, and gases such as $N_2$ and $O_2$, in addition to noble gases such as Ar.

Aluminum may be used as the material of the upper electrode 5 and the lower electrode 6. Aluminum nitride (AlN) may be used as the material of the upper dielectric 7 and the lower dielectric 8. As the material of the VHF wave waveguide 2 extending in the horizontal direction, air is used, but a dielectric material, such as quartz or alumina, may be used as the material of the VHF wave waveguide 2 as long as the waveguide can be formed. The material of the upper component 50 may be the same as that of the upper electrode 5, and a solid dielectric material, such as alumina, may be used as the dielectric material in the slot 50a.

As for a substrate disposed on the lower dielectric 8, silicon or the like may be used. The substrate may be subjected to processing such as film formation or etching. If necessary, it is conceivable to provide an electrostatic chuck, to apply a DC bias potential to the lower dielectric 8, or in some cases, to apply a radio-frequency voltage between the upper and lower electrodes. It is also conceivable to arrange magnets around the processing container.

Next, a gas introduction method will be described.

FIG. 4 is a view for explaining a vertical cross-sectional structure of a plasma processing apparatus (a third embodiment).

The apparatus of FIG. 4 is different from the apparatus of FIG. 3 only in that an insulator block 2B is used, and the others are the same. The VHF wave waveguide 2 is air. In an upper structure of the processing container 1, a horizontally-extending waveguide 2 communicating with a waveguide 1w constituted with a recess provided in the side wall of the processing container 1 is disposed. Here, the insulator block 2B made of a ring-shaped insulator is disposed between an outer conductor 3a and an inner conductor 3b. As a result, VHF waves introduced from the upper portion of the insulator block 2B reach the waveguide 1w extending in the vertical direction via the horizontally-extending waveguide 2w, and are introduced into the processing container via the VHF wave introduction portion 9. A thickness ΔZ of the insulator block 2B in the Z-axis direction is set to be optimal in a film forming process or an etching process.

Figure 5B:
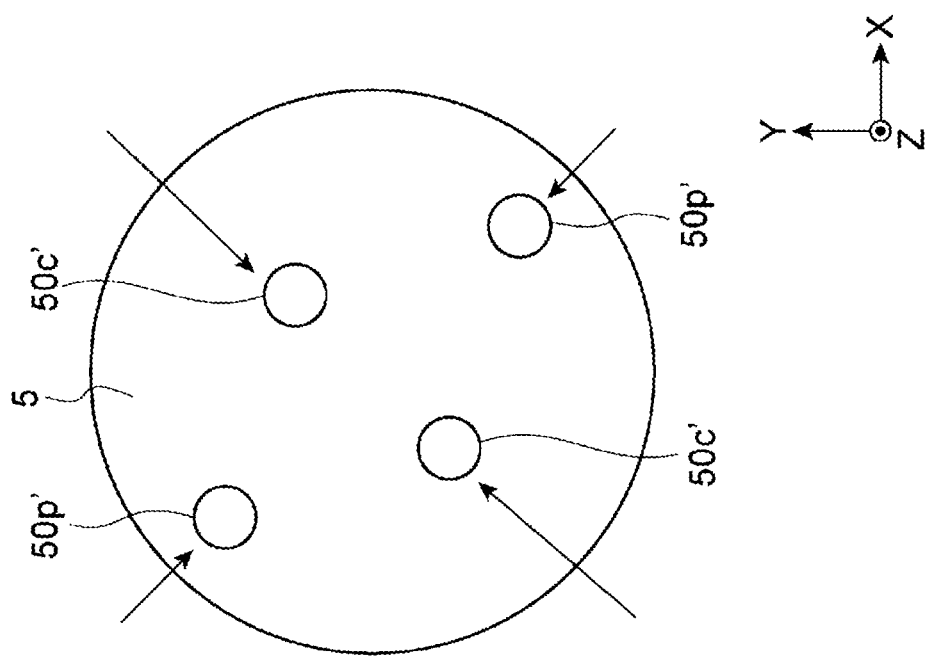
FIG. 5B is a plan view of the upper electrode.
Figure 5A:
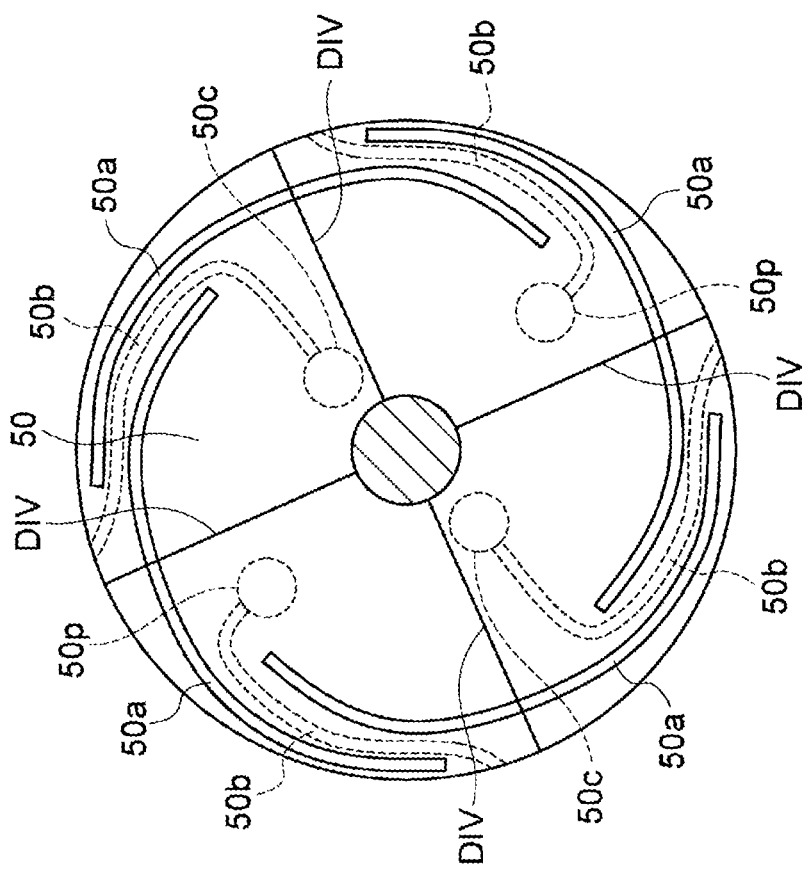
FIG. 5A is a plan view of a second upper component (an upper electrode) for performing introduction of VHF waves and gas.

FIG. 5A is a plan view of a second upper component (an upper electrode) for performing introduction of VHF waves and gas, and FIG. 5B is a plan view of the upper electrode 5.

An upper component 50 in FIG. 5A is obtained by dividing the upper component 50 in FIGS. 2A and 2B into a plurality of portions and fixing them at the back side. Division lines DIV extend in the radial direction of the upper component 50. The upper component 50 is divided into four portions in this example. When the divided upper component 50 is used, if there is a defective product in the individual components, it is possible to exclude the defective product in advance. Thus, it is possible to suppress the occurrence rate of defective products. In addition, since the upper component is divided, it is easy to handle the upper component. Thus, there is an advantage in that it is easy to assemble the upper component.

Figure 6B:
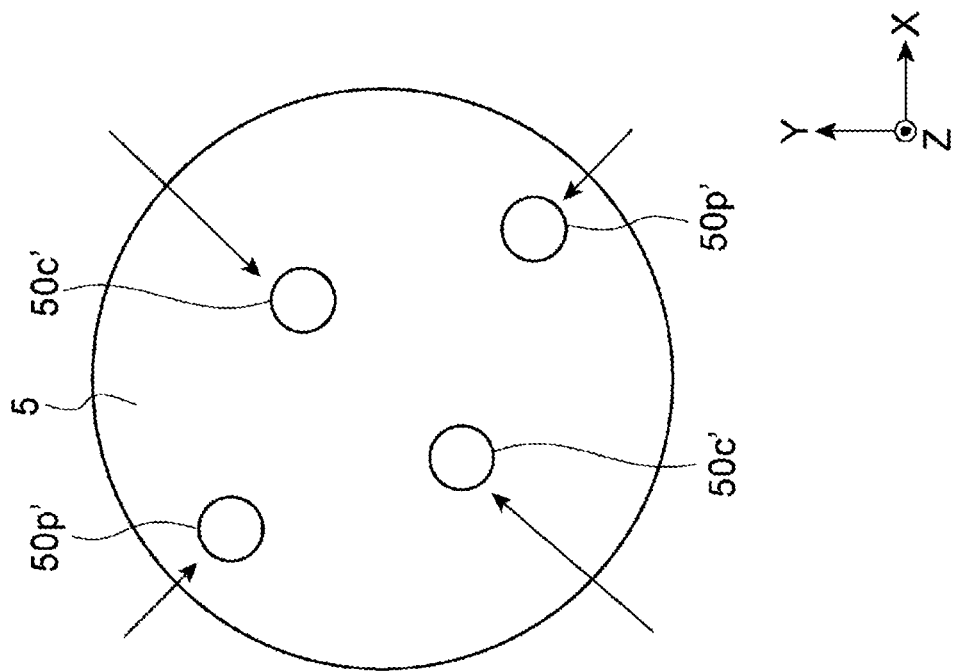
FIG. 6B is a plan view of the upper electrode.
Figure 6A:
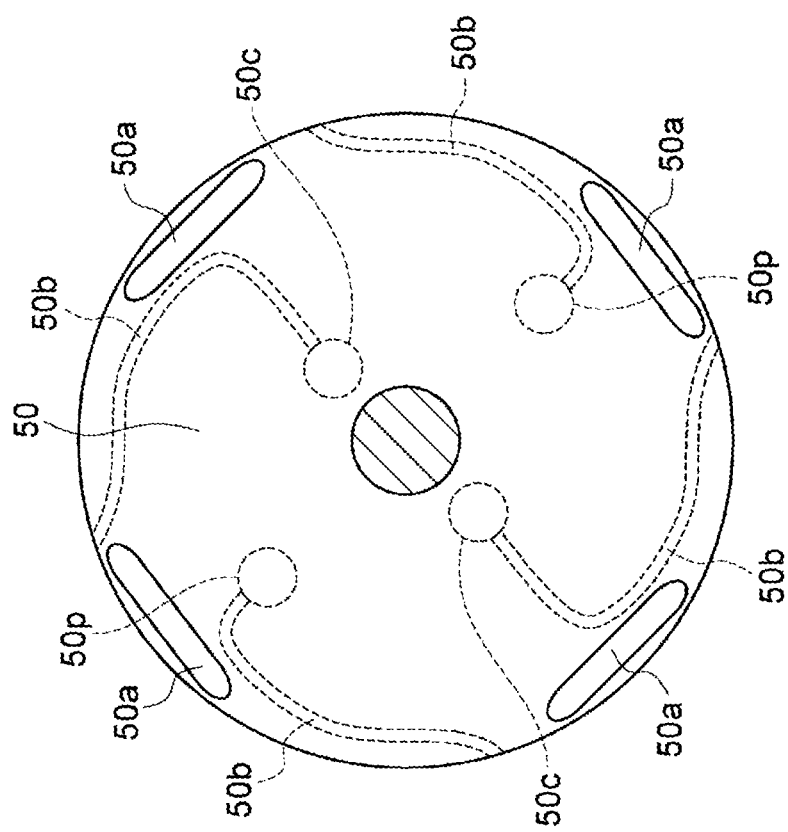
FIG. 6A is a plan view of a third upper component (an upper electrode) for performing introduction of VHF waves and gas.

FIG. 6A is a plan view of a third upper component (an upper electrode) for performing introduction of VHF waves and gas, and FIG. 6B is a plan view of the upper electrode 5.

An upper component 50 in FIGS. 6A and 6B is obtained by modifying the shape of each slot 50a in the upper component 50 of FIGS. 2A and 2B, and has a configuration in which the gas flow paths 50b are not interposed between the slots 50a located adjacent in the radial direction, unlike that illustrated in FIGS. 2A and 2B. As described above, when the slots and the gas flow paths are disposed independently of each other, it is possible to achieve the above-mentioned effects without being limited to the above-described examples.

EXPLANATION OF REFERENCE NUMERALS

DRV: drive stage, SP: plasma generation space, TEMP: temperature controller, 1: processing container, 1w: waveguide, 2: VHF wave waveguide, 2B: insulator block, 2w: waveguide, 3a: outer conductor, 3b: inner conductor, 4: exhaust passage, 5: upper electrode, 5d: recess, 6d: recess, 6: lower electrode, 7: upper dielectric (dielectric shower), 7A: gas diffusion plate, 8: lower dielectric, 9: VHF wave introduction portion, 10: gas source, 11: flow controller, 12: controller, 13: VHF wave generator, 14: exhaust device, 100: plasma processing apparatus, 50: upper component (upper electrode), 50a: slot, 50b: gas flow path.

What is claimed is:

1. A plasma processing apparatus comprising:
   an upper electrode and a lower electrode which are disposed inside a processing container so as to face each other inside the processing container; and
   a dielectric shower for gas introduction disposed below the upper electrode,
   wherein the plasma processing apparatus generates a plasma in a space between the upper electrode and the lower electrode, and
   wherein the upper electrode includes:
      at least one slot configured to introduce VHF waves into the processing container; and
      a gas flow path provided independently of the at least one slot and in communication with the dielectric shower,
   wherein the at least one slot includes a plurality of slots and each of the plurality of slots extends in a circumferential direction of the upper electrode, and
   wherein the gas flow path is disposed between the slots located adjacent to each other in a radial direction of the upper electrode.

2. The plasma processing apparatus of claim 1, further comprising:
   a gas diffusion plate interposed between the gas flow path and the dielectric shower so as to diffuse a gas in the circumferential direction and the radial direction.

3. The plasma processing apparatus of claim 1, wherein the gas flow path includes:
   a first flow path configured to supply the gas to a central region of the dielectric shower; and
   a second flow path configured to supply the gas to a peripheral region of the dielectric shower.

4. The plasma processing apparatus of claim 1, further comprising: a metal film formed on an upper surface of the dielectric shower.

5. The plasma processing apparatus of claim 1, wherein one end of each of the plurality of slots is located radially more outward of the upper electrode than the other end.

6. A plasma processing apparatus comprising:
   an upper electrode and a lower electrode which are disposed inside a processing container so as to face each other inside the processing container; and
   a dielectric shower for gas introduction disposed below the upper electrode,
   wherein the plasma processing apparatus generates a plasma in a space between the upper electrode and the lower electrode, and
   wherein the upper electrode includes:
      at least one slot configured to introduce VHF waves into the processing container; and
      a gas flow path provided independently of the at least one slot and in communication with the dielectric shower,
   wherein the at least one slot includes a plurality of slots,
   wherein each of the plurality of slots extends in a circumferential direction of the upper electrode,
   wherein one end of each of the plurality of slots is located radially more outward of the upper electrode than the other end, and
   wherein the gas flow path is disposed between the slots located adjacent to each other in a radial direction of the upper electrode.

* * * * *